United States Patent
Kawamura

(10) Patent No.: US 7,782,099 B2
(45) Date of Patent: Aug. 24, 2010

(54) SWITCHING CIRCUIT HAVING LOW THRESHOLD VOLTAGE

(75) Inventor: Hiroshi Kawamura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/238,242

(22) Filed: Sep. 25, 2008

(65) Prior Publication Data

US 2009/0079491 A1    Mar. 26, 2009

(30) Foreign Application Priority Data

Sep. 26, 2007    (JP)    ............... 2007-250170

(51) Int. Cl.
H03K 3/00    (2006.01)
(52) U.S. Cl. ...................... 327/108; 327/109
(58) Field of Classification Search ............... 327/108, 327/109, 110, 111, 112
See application file for complete search history.

(56) References Cited

U.S. PATENT DOCUMENTS

| 4,390,790 | A | * | 6/1983 | Rodriguez | ................. 250/551 |
| 4,492,883 | A | * | 1/1985 | Janutka | ..................... 327/377 |
| 4,691,129 | A | * | 9/1987 | Einzinger et al. | .......... 327/434 |
| 4,801,822 | A | * | 1/1989 | Idaka et al. | ................. 307/117 |
| 4,804,866 | A | | 2/1989 | Akiyama | |
| 4,853,563 | A | * | 8/1989 | Hill et al. | ..................... 326/83 |
| 4,873,202 | A | | 10/1989 | Akiyama | |
| 5,013,926 | A | * | 5/1991 | Aizawa | ...................... 250/551 |
| 5,045,709 | A | * | 9/1991 | Ogawa | ....................... 250/551 |
| 5,352,932 | A | * | 10/1994 | Tihanyi | ...................... 327/109 |
| 5,360,979 | A | * | 11/1994 | Joseph et al. | ............... 250/551 |
| 5,514,996 | A | * | 5/1996 | Aizawa | ...................... 327/514 |
| 5,909,139 | A | * | 6/1999 | Williams | ..................... 327/434 |
| 2005/0068706 | A1 | * | 3/2005 | Lewis | ........................ 361/100 |

FOREIGN PATENT DOCUMENTS

| DE | 44 29 285 C1 | 10/1995 |
| EP | 0 048 146 A1 | 3/1982 |
| JP | 63-099616 B1 | 4/1988 |
| JP | 8-79034 A | 3/1996 |
| JP | 2004-242475 A | 8/2004 |

OTHER PUBLICATIONS

Takeshi Kawasaki et al., "Normally-off AlGaN/GaN HEMT with Recessed Gate for High Power Applications", Extended Abstract of the 2005 International Conferences on Solid State Devices and Materials, Kobe, 2005, pp. 206-207.

* cited by examiner

*Primary Examiner*—Kenneth B. Wells
(74) *Attorney, Agent, or Firm*—Birch, Stewart, Kolasch and Birch, LLP

(57) ABSTRACT

A switching circuit for preventing malfunction of a switching device formed of a wide band-gap semiconductor used for switching a high-power main power supply includes a normally-off type FET having a gate electrode, a source electrode connected to the ground, and a drain electrode connected to a power supply potential Vdd, and a normally-on type FET having drain and source electrodes connected to the gate and source electrodes of the FET, respectively, and a gate electrode. In the absence of any power supply, the normally-on type FET turns on. As a result, the gate/source potential of FET attains to 0V, and FET is kept off.

19 Claims, 6 Drawing Sheets

SWITCHING CIRCUIT HAVING LOW THRESHOLD VOLTAGE

CROSS-REFERENCE TO RELATED APPLICATION

This nonprovisional application claims priority under 35 U.S.C. §119(a) on Patent Application No. 2007-250170 filed in Japan on Sep. 26, 2007, the entire contents of which are hereby incorporated by reference.

BACKGROUND OF THE INVENTION

1. Field of the Invention

The present invention relates to a technique for improving switching of a high-power main power supply and, more specifically, to a technique for preventing malfunction of a switching device of low threshold voltage.

2. Description of the Background Art

Switching devices widely used these days are dominantly implemented by Si transistors. Recently, however, a device formed of a wide band-gap semiconductor such as SiC or GaN is attracting attention. The reason for this is that a wide band-gap semiconductor realizes device performance exceeding limits of physical property of Si.

It is not easy, however, to replace an Si transistor with a transistor formed of a wide band-gap semiconductor, as the transistor formed of Si is a normally-off type device while most of the transistors formed of wide band-gap semiconductor are of normally-on type. Here, a transistor in which a current flows between terminals even when control voltage is 0V is referred to as a "normally-on type" transistor, and a transistor in which no current flows between terminals when control voltage is 0V is referred to as a "normally-off type" transistor.

In order to replace a power MOSFET (Metal-Oxide-Semiconductor Field-Effect Transistor) of Si, a normally-off type field effect transistor (hereinafter referred to as an FET) for switching, formed of GaN, for example, has come to be formed. Related technique is disclosed in Japanese Patent Laying-Open No. 2004-242475 (hereinafter referred to as '475 application). It is noted, however, that the threshold voltage of such transistor is about 0.2V, which is not very high.

Assume that a switching device is used for switching a main power supply for an inverter in an air conditioner or an inverter for solar cells. In such a case, the main power supply to be turned on/off by the switching device typically has a voltage of about 500V and supplies a current of about 50 A. When on/off of such high-power main power supply is to be controlled, it is difficult to insert an additional switch formed of a semiconductor or a relay to the current path to be switched. The reason for this is as follows. Even if the switch has a resistance of about 20 mΩ, power consumption by the switch would be 50 W when a current as large as 50 A is caused to flow therethrough, and hence, some measures, such as radiation, must be taken for the heat. Accordingly, it is often the case that a switching device used in an inverter or the like is kept subjected to the voltage from the main power supply.

In this connection, an HEMT (High Electron Mobility Transistor), which is one type of the normally-off type wide band-gap semiconductor FET, is disclosed in T. Kawasaki et al., "Normally-off AlGaN/GaN HEMT with Recessed Gate for High Power Applications", Ext. Abst. 2005 Int. Conf. on Solid State Devices and Materials, September 2005, pp. 206-207.

At present, however, it is difficult to use HEMT in accordance with Kawasaki et al., as the switching device for a high-power main power supply, because such transistor has low threshold voltage, as mentioned above.

The power supply voltage controlled by the switching device is about tens to hundreds volts (V) and it possibly exceeds 1000V. The current value is a few to tens of amperes (A) and it possibly exceeds 100 A. Turning on/off of such high voltage possibly involves generation of noise voltage equal to or higher than the power supply voltage, at the main power supply. Further, because of capacitive coupling or electromagnetic coupling between the main power supply and the control circuit, high-level noise voltage also generates in the control circuit. If the threshold voltage is low, there is a high risk that such noise voltage causes malfunction of the switching device. In a high-power power supply, other switching circuits and the like are connected in parallel with the main power supply. When these circuits turn on/off the high voltage and high current as described above, noise voltage may be generated in the main power supply. In addition, because of capacitive coupling or electromagnetic coupling between the main power supply and other control circuits in the apparatus, high-level noise voltage also generates in the control circuits.

At present, for a normally-off type switching device of which threshold voltage is 1V or smaller, a practical switching circuit has not yet been studied, and the problem of malfunction of the switching device caused by the noise voltage is not recognized. The inventor studied the influence of noise on a switching circuit including a switching device formed of a normally-off type wide band-gap semiconductor.

FIG. 1 is a circuit diagram of a polarity reversing circuit 10 including a conventional switching device, which shows the principle of malfunction caused by noise in a relatively easy manner. Referring to FIG. 1, polarity reversing circuit 10 includes: a normally-off type field effect transistor 20 formed of GaN, for example, having its drain electrode connected to a main power supply voltage Vdd (hereinafter simply denoted as "Vdd"); and a driving pulse generating circuit 22 for driving FET 20, connected to source and gate electrodes of FET 20. The driving pulse generating circuit includes an output circuit 50 for outputting the driving pulse to FET 20.

FET 20 has a threshold voltage Vth of 0.3V. Driving pulse generating circuit 22 is connected between a power supply voltage Vdd2 (hereinafter denoted as "Vdd2") for circuit operation and the ground. The main power supply voltage Vdd has the voltage of 500V and the current of 50 A. Vdd2 is a relatively low voltage of about 10 to 20V, which is generated by a separate circuit, from Vdd.

The circuit 10 further includes a resistor 24 for stabilizing gate potential, connected between the gate electrode and the source electrode of FET 20. As the output impedance of driving circuit for FET 20 is a few Ω, a resistor having the resistance value several tens to several hundreds of times higher is used as resistor 24.

The circuit 10 further includes: a diode 28 having its cathode electrode connected to the source electrode of FET 20; an inductor 26 connected between the ground and a node between the source electrode of FET 20 and diode 28; a load 32 connected to the anode electrode of diode 28; and a smoothing capacitor 30 connected between the ground and the anode electrode of diode 28. Here, the load refers to a circuit that operates with the electric power applied from power supply potential Vdd and FET 20.

In FET 20, there is a parasitic capacitance component derived from gate/drain capacitance 42 and gate/source capacitance 44, referred to as a feedback capacitance.

FIG. 2 shows a circuit structure of driving pulse output circuit 50 of driving pulse generating circuit 22 shown in FIG. 1. Referring to FIG. 2, output circuit 50 includes: a normally-off type, P-type MOSFET 56 and a normally-off type, N-type MOSFET 58 having drain terminals connected to each other; an input terminal 52 commonly connected to the gate terminals of these; and an output terminal 54 commonly connected to the drain terminal of these. P-type MOSFET 56 has its source electrode connected to power supply potential Vdd2. N-type MOSFET 58 has its source connected to a source potential.

In polarity reversing circuit 10 shown in FIG. 1, assume that the power supply to driving pulse generating circuit 22 is turned off, while a voltage is constantly applied to Vdd. Referring to FIG. 2, in such a situation, power supply potential Vdd2 comes to have high impedance. Therefore, the source and gate potentials of MOSFETs in driving pulse generating circuit 22 come to be equal to the source potential Vss2 of the switching device. Accordingly, the output of driving pulse generating circuit also comes to be equal to Vss2. As a result, the source, drain and gate potentials of the MOSFETs of driving pulse generating circuit 22 all come to have the same potential. In such a state, the voltage between the source/gate of each of the P-type MOSFET 56 and N-type MOSFET 58 is 0V and, therefore, these normally-off type transistors are turned off, and the output impedance is kept high.

Referring to FIG. 1, the gate electrode and the source electrode of FET 20 are connected by resistor 24. Therefore, the gate/source potential of FET 20 attains to 0V, and PET 20 is turned off. Further, the source potential of FET 20 is 0V, as it is grounded through inductor 26.

Here, assume that a noise signal equal to or higher than the power supply voltage is generated by other switching operation, as described above. If the noise signal has a frequency lower than the switching frequency of the circuit, the impedance of inductor 26 lowers. Inductor 26 does not function as an inductance. The noise voltage derived from the noise signal is divided by a series connection of gate/drain capacitance 42 and parallel connected gate-source capacitance 44, driving pulse generating circuit 22 and resistor 24. The divided noise voltage is applied to the gate electrode of FET 20. As the power supply to driving pulse generating circuit 22 is off, it has relatively high output impedance. Therefore, when considering voltage division, driving pulse generating circuit 22 is substantially negligible.

By way of example, when the main power supply voltage is 500V and the current is 50 A, in FET 20 used in such a circuit, the gate/drain capacitance 42 is about tens of pF and the gate/source capacitance is about hundreds of pF. When driving pulse generating circuit 22 turns FET 20 on, part of the driving current flows to resistor 24 and, therefore, a resistor of small resistance value cannot be used as resistor 24. Therefore, typically, a resistor having the resistance value tens to hundreds of times larger than the output impedance at the time of operation of the driving circuit is used. Accordingly, resistor 24 has a resistance value of hundreds of Ω.

Assume that the gate/drain capacitance 42 is 50 pF, gate/source capacitance 44 is 500 pF, resistor 24 has the resistance value of 200Ω, and the noise signal frequency is 50 kH, which is one-half the general switching frequency of 100 kHz. In this case, because of the influence of gate/source capacitance 44 and resistor 24, a voltage of about 1/320 of noise voltage is applied to the gate electrode. If the noise voltage is the same as the power supply voltage of 500V, it follows that a noise of 1.6V generates at the gate electrode. Though it depends on the noise level, frequency and parasitic capacitance component, the noise voltage would be a few volts (V).

The threshold voltage of FET 20 is 0.3V and therefore, it may possibly be turned on by the noise voltage. Generally, when a power supply voltage of 300V or higher is used, malfunction caused by noise is possible if the threshold voltage is 2V or lower. In this regard, in a conventionally used power MOSFET of silicon having breakdown voltage of about 500V, the threshold voltage is about 2 to about 5V. Therefore, the switching device will not be turned on by such noise.

In polarity reversing circuit 10, if FET 20 should turn on at a frequency lower than the actual operation frequency, inductor 26 would not operate as an inductor. As a result, power supply voltage Vdd would be grounded through inductor 26, and a large current could flow through FET 20. Such malfunction increases the risk of breakdown of FET 20, heat generation of circuit lines and fire caused by overheat of FET 20 resulting from excessive current.

A conventional full bridge inverter circuit 70 also faces similar problems. FIG. 3 is a circuit diagram of a conventional full bridge inverter circuit 70.

Referring to FIG. 3, full bridge inverter circuit 70 includes normally-off type FETs 80, 82, 84 and 86 for switching Vdd, to apply power to a load 90. Normally-off type FETs 80 and 84 have drain electrodes connected to Vdd. FET 80 has its source electrode connected to one terminal of load 90, and FET 84 has its source electrode connected to the other terminal of load 90. FET 82 has its drain electrode connected to the source electrode of FET 80 and its source electrode grounded. FET 86 has its drain electrode connected to the source electrode of FET 84, and its source electrode grounded.

Full bridge inverter circuit 70 further includes a driving pulse generating circuit 88, connected between a power supply voltage Vdd2 for circuit operation and the ground, for applying driving pulses to the gate electrodes of FETs 80, 82, 84 and 86.

Referring to FIG. 3, in full bridge inverter circuit 70, if FETs 80 and 82 are turned on simultaneously because of a noise voltage, Vdd would be short-circuited to the ground through normally-off type FETs 80 and 82. This leads to possible problems such as device breakdown or fire resulting from heat generation in the circuit.

As described above, according to the study made by the inventor of the present invention, when a normally-off type FET having relatively low threshold voltage is used as a switching device in polarity reversing circuit 10 or full-bridge inverter circuit 70, there is a risk of circuit breakdown caused by a malfunction, or an accident resulting from heat generation in the circuit. There is a same concern in a half bridge circuit, chopper circuit and the like.

In order to reliably keep off the switching device, it is necessary to add a negative voltage generating circuit to the circuit and to control the same such that it operates in synchronization with the main power supply, as disclosed in '475 application. In that case, however, the negative voltage is used for turning the gate on/off. Therefore, a negative voltage generating circuit having high current driving capability for driving the gate capacitance at high speed, must be used.

Addition of the negative voltage generating circuit having such high output and the control of the same for coordinated operation with the main power supply lead to much complicated circuit structure and hence to higher cost of the product. Further, it is necessary to constantly supply power to the control circuit in coordination with the main power supply. Therefore, the control circuit continuously consumes power even when it is not in operation. Further, the circuit structure would be significantly different from the conventional power MOSFET, resulting in the necessity of large-scale development of new products.

SUMMARY OF THE INVENTION

Therefore, an object of the present invention is to provide a switching circuit and an output circuit for realizing switching less susceptible to malfunction, in a switching circuit for high-power main power supply, including a normally-off type switching device formed of a wide band-gap semiconductor.

Another object of the present invention is to realize reduction of on-resistance, higher speed of operation and smaller power consumption of the switching circuit for high-power main power supply, through the switching circuit and the output circuit.

According to a first aspect, the present invention provides a switching circuit including: a normally-off type first active device, for example, an FET, having first and second electrodes and a control electrode; and a normally-on type second active element, for example, an FET, having drain and source electrodes connected to the control electrode and the first electrode of the first active device, respectively, and a gate electrode.

The first active device has the control electrode and the first electrode connected to the drain and source electrodes of the second active device, respectively. The switching circuit is driven by the driving pulse generating circuit applying the pulse to the control electrode of the first active device. Here, to the gate electrode of the second active device, a voltage for stably turning off the second active device is adapted to be applied from the driving pulse generating circuit. If the power supply to the driving pulse generating circuit is off, the potential of a connection destination of the source electrode of the second active device is selected such that the potential of a node between the driving pulse generating circuit and the gate electrode of the second active device comes to have the same potential as the source electrode of the second active device. In most cases, the potential corresponds to the ground potential.

In the normal operation, the second active device is stably off, because of the voltage from the driving pulse generating circuit. Therefore, the second active device does not have any influence on the operation of the first active device. When the power supply to the driving pulse generating circuit is cut off, the potential at the node between the driving pulse generating circuit and the gate electrode of the second active device becomes equal to the potential of the source electrode of the second active device. As a result, the second active device of normally-on type turns on. The control electrode and the first electrode of the first active device are short-circuited with low-impedance, by the second active device. Therefore, the potential difference between the control electrode and the first electrode of the first active device attains to 0V. As a result, the first active device of normally-off type can be stably kept off, even if noise generates while the power supply voltage is constantly applied between both electrodes of the first active device. Even if the first active device is a normally-off type FET formed of a wide band-gap semiconductor having threshold value of 2V or lower, malfunction of the first active device caused by noise can be prevented.

Preferably, the switching circuit further includes a resistor circuit connected between the gate electrode and the source electrode of the second active device.

In the switching circuit of the present invention, the gate electrode and the source electrode of the second active device are connected by a resistor circuit. Therefore, when the driving pulse generating circuit as described above is connected to the switching circuit and the power supply to the driving pulse generating circuit is cut off, the output impedance of the pulse generating circuit could become high. Even in that case, because of the resistor circuit connected between the gate electrode and the source electrode of the second active device, the potential difference between the gate electrode and the source electrode of the second active device eventually attains to 0V, and the second active device turns on. As a result, the first active device can be kept off. In the present switching circuit, even when noise voltage generates, malfunction of the first active device can be prevented.

Preferably, the resistor circuit includes a resistor connected between the gate electrode and the source electrode of the second active device.

The gate electrode and the source electrode of the second active device are connected by a resistor. Therefore, even when the driving pulse generating circuit as described above is connected to the switching circuit and the power supply to the driving pulse generating circuit is cut off, the voltage between the gate electrode and the source electrode of the second active device can reliably be set to 0V. As a result, the first active device can be kept off and the malfunction can be prevented.

The resistor circuit may be a third normally-on device with the gate and source electrodes connected each other. The conductivity type can be either of p type or n type. The gate width is narrow enough to keep the current low.

When such a resistor circuit is used, the third active device acts as high resister, if the driving pulse generating circuit as described above is connected to the switching circuit and the power supply to the driving pulse generating circuit is cut off. Therefore, because the third active device acts as resistor, the voltage between the gate electrode and the source electrode of the second active device can reliably be set to 0V. As a result, the first active device can be kept off and the malfunction can be prevented.

The resistor circuit may be a third normally-off device with the gate and drain electrodes connected each other. The gate width is narrow enough to keep the current low. Also the absolute value of the threshold voltage of the third device should be lower than that of the second active device.

When such a resistor circuit is used, for the same reason as that of the resistor used as the resistor circuit, the third active device acts as high resister above the threshold voltage of the third device, if the driving pulse generating circuit as described above is connected to the switching circuit and the power supply to the driving pulse generating circuit is cut off. Therefore, the voltage between the gate electrode and the source electrode of the second active device can reliably be set to the threshold voltage of the third device. The second active device turns on since the absolute value of the threshold voltage of the second device is higher than that of the third device. As a result, the first active device can be kept off and the malfunction can be prevented.

The switching circuit may further include a third active device of a conductivity type different from that of the second active device, having a first electrode connected to a power supply potential, a second electrode connected to the control electrode of the first active device, and a control electrode connected to the control electrode of the second active device.

When the switching circuit includes the third active device connected to the second active device as described above, a complementary type circuit is formed by the second and third active devices. By applying an input signal to the control electrode of the complementary circuit, it becomes possible to operate the switching circuit with low power. Because of the presence of the second active device, malfunction of the first active device can be prevented. Specifically, by using the second active device in the complementary type circuit for driving the first active device, it becomes possible to prevent malfunction without increasing the number of circuit elements.

According to a second aspect, the present invention provides a circuit, including a switching circuit and a driving pulse generating circuit connected to the switching circuit, generating and applying to the switching circuit pulses for driving the switching circuit. The switching circuit includes a normally-off type first FET having a gate electrode connected to receive the pulses from the driving pulse generating circuit and source and drain electrodes. The driving pulse generating circuit includes a control circuit receiving an input signal and generating and outputting a driving signal for driving the first FET, and an output circuit connected to receive the driving signal from the control circuit, for applying the pulses making transitions between prescribed first and second potentials to the gate electrode of the first FET in response to the driving signal. The output circuit includes: an input terminal connected to receive an output of the control circuit; an output terminal connected to the gate electrode of the first FET; a normally-off type, P-type second FET having a gate electrode connected to the input terminal, a source electrode connected to a power supply potential, and a drain electrode connected to the output terminal; and a normally-on type, N-type third FET having a gate electrode connected to the input terminal, a source electrode connected to the source electrode of the first FET, and a drain electrode connected to the output terminal.

The switching circuit switches power supply in response to on/off of the first FET. The driving pulse generating circuit applies a pulse signal to the gate terminal of the first FET, to control its on/off. At this time, the control circuit generates a driving signal for driving the first FET in accordance with the input signal, and outputs the same to the output circuit. In response to the driving signal, the output circuit formed of the second and third FETs generates pulses for operating the first FET and supplies them to the gate electrode of the first FET through an output terminal. The pulses make transitions between a potential at which the first FET turns on and a potential at which it turns off.

The gate electrode/and the source electrode of the first FET are connected to the drain electrode and the source electrode of the third FET, respectively. Therefore, if the power supply to the driving pulse generating circuit is off, the voltage between the gate electrode and the source electrode of the third FET attains to 0V. The third FET of normally-on type turns on. As a result, the voltage between the gate electrode and the source electrode of the first FET attains to 0V. As the first FET is of normally-off type, the off state can be maintained. Even when the power supply to the driving pulse generating circuit is off and the noise voltage generates, there is no possibility that the first FET turn on. As a result, even when the power supply voltage is constantly applied between the source and drain electrodes of the first FET, malfunction of the switching circuit can be prevented.

As described above, according to the present invention, switching operation less prone to malfunction can be realized by using a normally-off type switching device formed of a wide band-gap semiconductor having the threshold voltage of 2V or lower. Therefore, the conventional Si power MOSFET can be replaced by the switching device formed of a wide band-gap semiconductor such as GaN, as the switching device for high-power main power supply used in an inverter of IH (Inductive Heating), an air conditioner, solar cells or a DC/DC converter. As a result, the present invention realizes reduction of on-resistance, higher speed of operation and smaller power consumption of the switching device for high-power main power supply.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
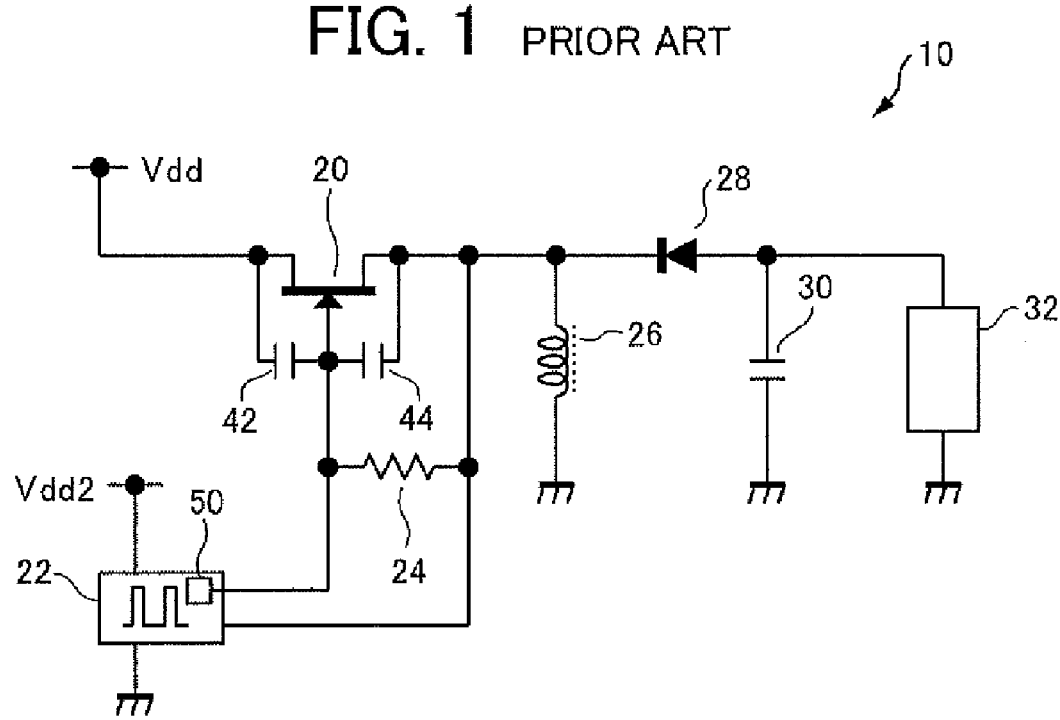
FIG. 1 is a circuit diagram showing a conventional polarity reversing circuit 10.

In the following description and in the drawings, the same components are denoted by the same names and same reference characters. Their functions are also the same. Therefore, detailed description thereof will not be repeated here.

First Embodiment

-Structure-

Figure 4:
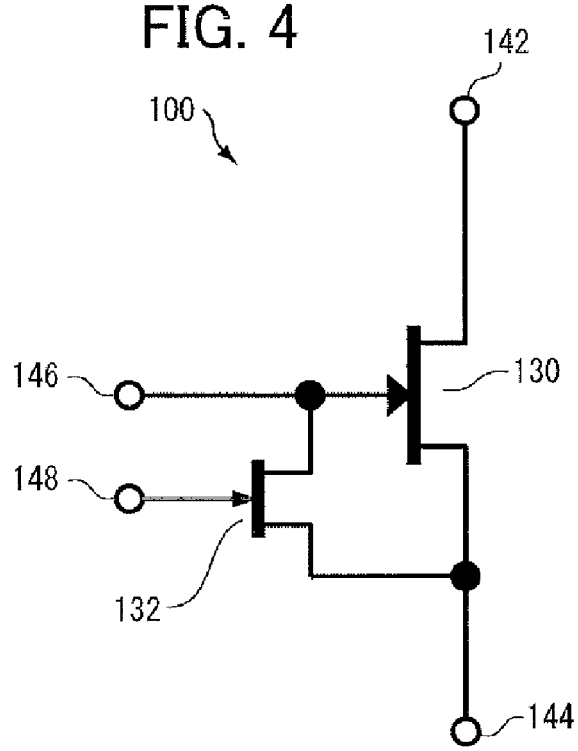
FIG. 4 is a circuit diagram of a switching circuit 100 in accordance with the first embodiment of the present invention.

FIG. 4 shows a basic structure of a switching circuit 100 in accordance with a first embodiment of the present invention. Referring to FIG. 4, switching circuit 100 includes: a normally-off type FET 130 implemented by an AlGaN/GaN HEMT formed of a stacked structure of GaN/AlGaN, having a drain electrode 142 and a source electrode 144; and a terminal 146 connected to the gate electrode of FET 130 and receiving driving pulses for FET 130 from the outside. In the present embodiment, the threshold voltage of FET 130 is 0.3V.

Switching circuit 100 further includes: a normally-on type FET 132 having its drain electrode and source electrode connected to the gate electrode and the source electrode 144 of FET 130, respectively, and a terminal 148 connected to the gate electrode of normally-on type FET 132. Terminal 148 is for receiving a signal for stabilizing the gate potential of normally-on type FET 132, from the outside. In the present embodiment, the threshold voltage of normally-on type FET 132 is −2V.

Figure 5:
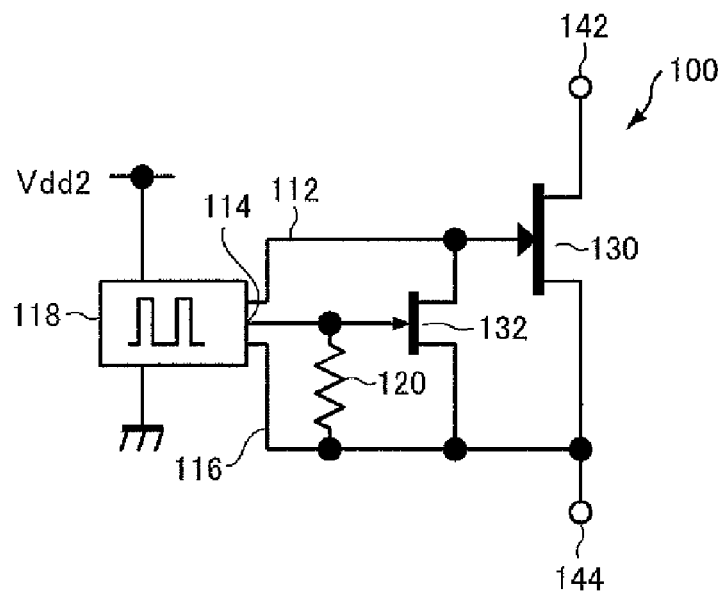
FIG. 5 is a circuit diagram of a circuitry including switching circuit 100.

FIG. 5 shows a circuit structure of a basic circuit including switching circuit 100 and a driving pulse generating circuit 118 for driving switching circuit 100.

Referring to FIG. 5, FET 130 has its drain electrode 142 connected to a power supply potential Vdd, not shown, and its source electrode 144 grounded. Driving pulse generating circuit 118 has a pulse driving terminal 112 connected to the gate electrode of FET 130 and applying a control voltage for controlling FET 130 so that desired switching is attained, a gate potential stabilizing control terminal 114 connected to the gate electrode of normally-on type FET 132, and a source connection terminal 116 connected to the source electrode.

The basic circuit further includes a resistor 120 connected between the gate electrode and the source electrode of normally-on type FET 132, for reliably turning on the normally-on type FET 132, with the power supply to driving pulse generating circuit 118 being off.

Between the source electrode 144 of FET 130 and the ground, a load, not shown, is connected. The load represents a control circuit realizing, in the apparatus including the circuit shown in FIG. 5, the original function of the apparatus. Specifically, switching operation of switching device 100 controls on/off of the apparatus itself.

Driving pulse generating circuit 118 is connected between the power supply potential Vdd2 for circuit operation and the ground. The ground potential of source electrode 144 of FET 130 and driving pulse generating circuit 118 may be shared. Driving pulse generating circuit 118 includes a negative voltage generating circuit, not shown, and the negative voltage generating circuit applies a voltage that sufficiently turns off the normally-on type FET 132, to gate potential stabilizing control terminal 114, when the driving pulse generating circuit 118 is driven. In the present embodiment, the negative voltage is about −3V, with the source potential being the reference.

-Operation-

The switching circuit 100 shown in FIG. 5 operates in the following manner.

Referring to FIG. 5, when the circuit is driven, driving pulse generating circuit 118 applies control voltages to the gate electrode of FET 130 and to the gate electrode of normally-on type FET 132, through pulse driving terminal 112 and gate potential stabilizing control terminal 114, respectively. The control voltage applied to the gate electrode of normally-on type FET 132 is a voltage (about −3V) that ensures sufficient turn-on of normally-on type FET 132, with respect to the source potential. In this state, normally-on type FET 132 is fully off, and it does not have any influence to the operation of FET 130.

As the source electrode 144 of FET 130 is grounded, a negative voltage generating circuit that generates a negative voltage of about −3V to be applied to normally-on type FET 132 is provided in driving pulse generating circuit 118, as described above. Normally-on type FET 132, however, does not perform a switching operation and, therefore, gate current hardly flow. Further, what is necessary is that the voltage is kept below a prescribed voltage. Therefore, required accuracy of voltage setting is not very high. Accordingly, switching circuit 100 operates without any problem with a negative voltage generating circuit that generates a negative voltage by a simple method, for example, of inverting the power supply voltage with a capacitor and a switch.

Assume that power supply from Vdd2 is off and driving pulse generating circuit 118 is not in operation. The voltage at pulse driving terminal 112 of driving pulse generating circuit 118 attains to 0V, while the output impedance becomes high. The negative voltage generating circuit, not shown, in driving pulse generating circuit 118 generates the negative voltage by inverting the power supply voltage of the driving circuit using a capacitor or a switch. Therefore, when the power supply voltage of the driving circuit attains to 0V, eventually, the negative voltage of negative voltage generating circuit attains to 0V.

At this time, the output impedance of gate potential stabilizing control terminal 114 and the input impedance of the gate electrode of normally-on type FET 132 both become relatively high and, therefore, because of resistor 120, the potential difference between the source/gate of normally-on type FET 132 attains to 0V. As a result, normally-on type FET 132 turns on. The source and gate of FET 130 is short-circuited with low impedance, and the voltage between the source/gate of FET 130 attains to 0V. As the FET 130 is of normally-off type, FET 130 turns off.

In this state, assume that a noise signal from Vdd enters drain electrode 142 of FET 130 and through the gate/drain capacitance of FET 130, the noise signal enters the gate of FET 130. At this time, normally-on type FET 132 is on, as described above. The gate and source of FET 130 is short-circuited with relatively low impedance. As a result, the voltage between the source and gate of FET 130 attains to 0V, and FET 130 never turns on.

As described above, according to the switching circuit 100 in accordance with the first embodiment, even when the threshold value of FET 130 is relatively low, FET 130 is not turned on by the noise signal. Therefore, there is no possibility that a large current flows between power supply potential Vdd and the ground through FET 130 and, therefore, the risk of circuit breakdown or fire can be reduced.

It is noted that, in principle, switching circuit 100 operates normally even when the resistor 120 is not provided. By providing resistor 120, however, the gate/source voltage of normally-on type FET 132 can reliably be set to 0V and, therefore, higher safety is attained.

Second Embodiment

-Structure-

Figure 6:
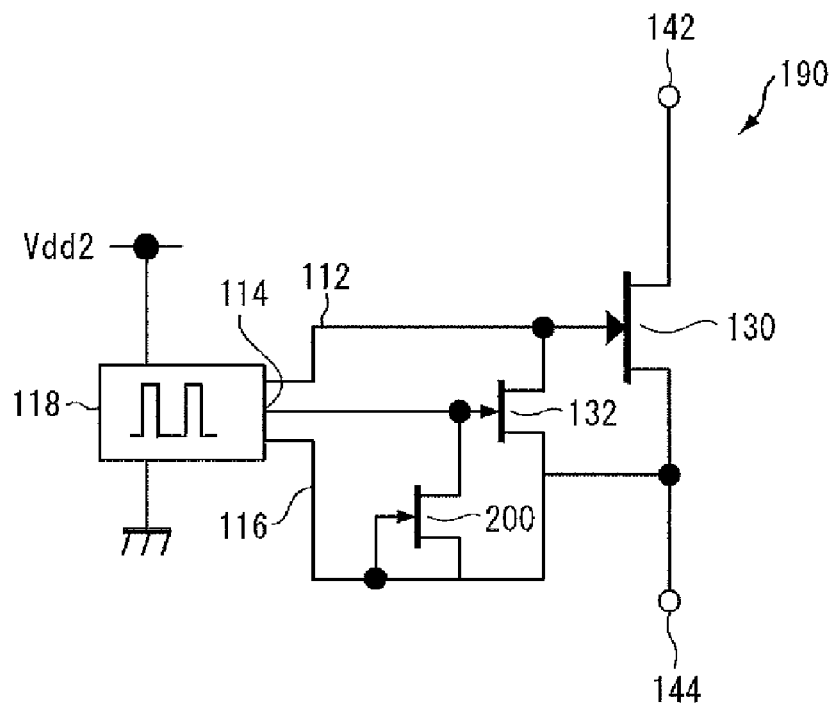
FIG. 6 is a circuit diagram of a circuitry including a switching circuit 190 in accordance with a second embodiment of the present invention.

FIG. 6 is a circuit diagram of a switching circuit 190 in accordance with a second embodiment of the present invention.

Referring to FIG. 6, switching circuit 190 has substantially the same structure as the switching circuit 100 shown in FIG. 5. However, it is different from switching circuit 100 shown in FIG. 5 in that it includes, in place of resistor 120 shown in FIG. 5, a normally-on type FET 200 having its source electrode and gate electrode connected commonly to the gate electrode of normally-on type FET 132 and its source electrode connected to the source electrode of normally-on type FACT 132. The gate width of the FET 200 is narrow enough to keep the current low.

- Operation-

The switching circuit 190 shown in FIG. 6 operates in the following manner.

As is well known, an FET has a characteristic similar to a very high resistance between the source/drain. Therefore, normally-on type FET 200 operates in the similar manner as resistor 120 shown in FIG. 5.

Referring to FIG. 6, specifically, when the circuit is driven, driving pulse generating circuit 118 applies a voltage sufficient to cause normally-on type FET 132 to fully turn off, through gate potential stabilizing control terminal 114.

Assume that power supply from Vdd2 is off and driving pulse generating circuit 118 is not in operation. The voltage applied from gate potential stabilizing control terminal 114 becomes high impedance. The impedance between the source/drain of normally-on type FET 200 is lower than that between gate potential stabilizing control terminal 114/ source connection terminal 116. Therefore, normally-on type FET 200 short-circuits the source and gate of normally-on type FET 132 and to bring the source/gate voltage of normally-on type FET 132 to 0V. Thus, normally-on type FET 132 turns on. As a result, switching circuit 190 in accordance with the present embodiment also attains the same effects as attained by the first embodiment.

Resistor 120 used in the first embodiment is provided for higher safety and it is dispensable. Therefore, the gate width of normally-on type FET 200 may be small, and hence, even when it is formed on the same substrate as FET 130 and normally-on type FET 132, it does not have any significant influence on the device size.

Further, the gate length of normally-on type FET 200 may be made longer. This increases resistance of normally-on type FET 200, and hence, FET 130 can be set to the off state with higher reliability.

Third Embodiment

Figure 7:
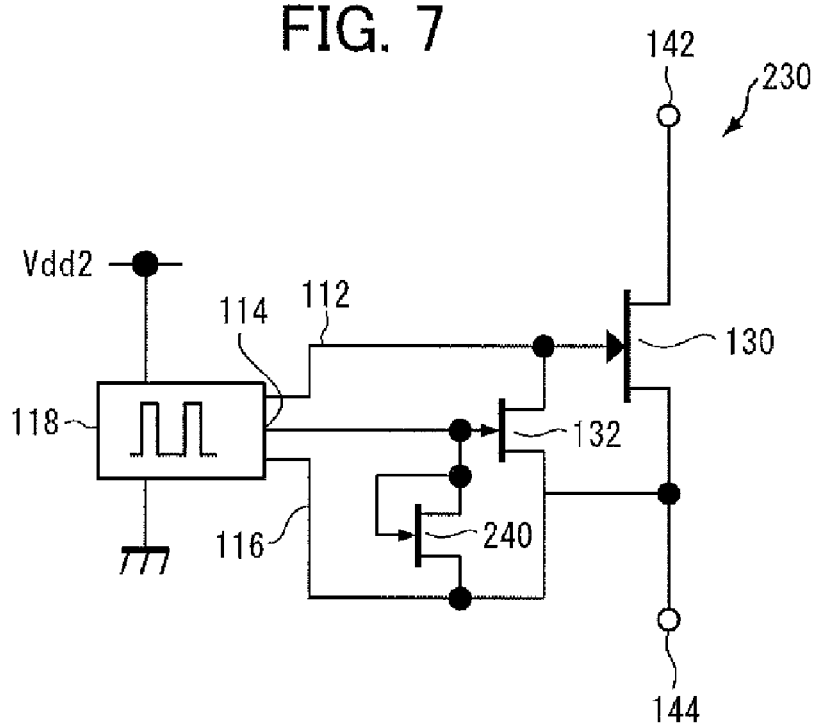
FIG. 7 is a circuit diagram of a circuitry including a switching circuit 230 in accordance with a third embodiment of the present invention.

FIG. 7 is a circuit diagram of a switching circuit 230 in accordance with a third embodiment of the present invention.

Referring to FIG. 7, the circuit has substantially the same structure as that of the switching circuit 100 shown in FIG. 5. However, it is different from switching circuit 100 shown in FIG. 5 in that it includes, in place of resistor 120 shown in FIG. 5, a normally-off type FET 240 having its drain electrode connected to the gate electrode of normally-on type FET 132 and its source electrode and gate electrode commonly connected to the source electrode of normally-on type FET 132.

Generally, in a transistor of a GaN switching element, the threshold voltage can freely be changed by adjusting the etching time during manufacturing of the device. It is assumed that the threshold voltage Vth3 of normally-off type FET 240 and the threshold voltage Vth2 of normally-on type FET 132 are adjusted to satisfy the relation of |Vth3|<|Vth2|. In the present embodiment, Vth=−2V, and Vth3=1V.

In switching circuit 230 also, normally-off type FET 240 attains the same function as resistor 120 shown in FIG. 5. As a result, switching circuit 230 operates in the similar manner as the switching circuit 100 in accordance with the first embodiment and the switching circuit 190 in accordance with the second embodiment, and attains the similar effects.

Referring to FIG. 7, specifically, when the circuit is driven, control voltages are applied to normally-on type FET 132 through gate potential stabilizing control terminal 114 and to normally-off type FET 240 through source connection terminal 116, respectively. In the following, the source/gate voltages of the two FETs will be referred to as VGS2 for normally-on type FET 132 and VGS3 for normally-off type FET 240. VGS2 is a voltage (about −3V) that causes normally-on type FET 132 to fully turn off, and VGS3 is a voltage (about 1.5V) that causes normally-off type FET 240 to fully turn on. It is assumed that, in the present embodiment, the voltages are adjusted to satisfy the relation of |VGS3|<|Vth2|.

Assume that the power supply from Vdd2 is cut off by some cause or other, and driving pulse generating circuit 118 is not in operation. Immediately after the cut off, a voltage is held between the source connection terminal 116/gate potential stabilizing control terminal 114, because of parasitic capacitance and the like. Therefore, normally-off type FET 240 is kept on. The source/gate voltage VGS2 of normally-on type FET 132 has a value equal to source/gate voltage VGS3 of normally-off type FET 240, with the sign inverted (VGS2=−VGS3). Further, as the normally-off type FET 240 is on, its gate/source voltage VGS3 lowers. Because of the two reasons described above, the source/gate voltage VGS2 does not exceed Vth2. Therefore, normally-on type FET 132 turns on. As a result, switching circuit 230 in accordance with the present embodiment also attains the same effects as in the first embodiment.

Fourth Embodiment

-Structure-

Figure 8:
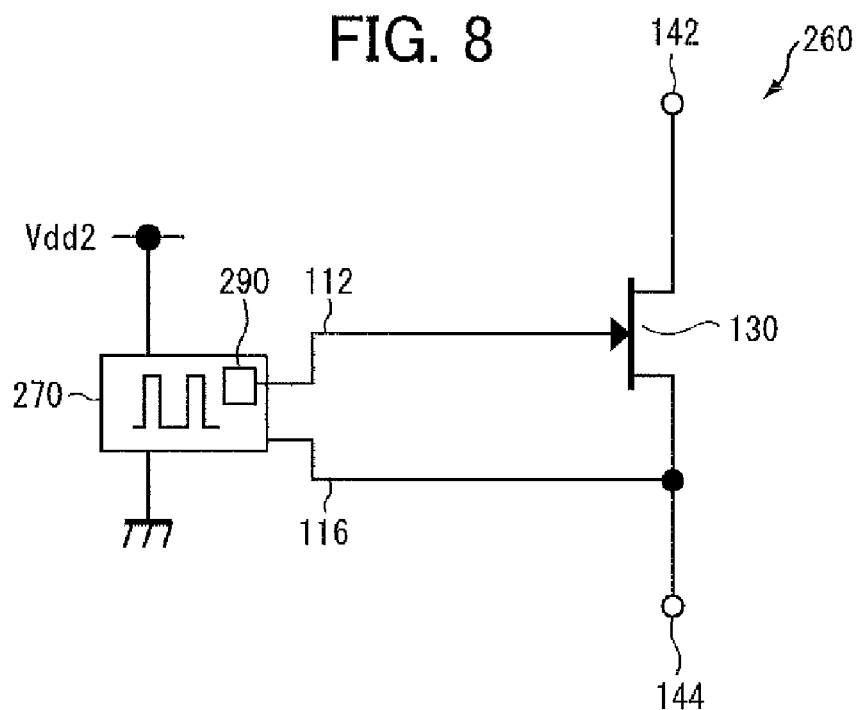
FIG. 8 is a circuit diagram of a circuitry including a driving pulse generating circuit 270 and a switching circuit 260 in accordance with a fourth embodiment of the present invention.

FIG. 8 is a circuit diagram of a basic circuit including a switching circuit 260 in accordance with the fourth embodiment of the present invention.

Referring to FIG. 8, the basic circuit includes a switching circuit 260 with FET 130, and a driving pulse generating circuit 270 connected between power supply potential Vdd2 and the ground and having a pulse driving terminal 112 and a source connection terminal 116, for driving switching circuit 260.

Switching circuit 260 has a similar structure as switching circuit 100 shown in FIG. 5. It is noted, however, that switching circuit 260 does not include normally-on type FET 132 and resistor 120 shown in FIG. 5. The circuit in accordance with the present embodiment is characterized in that the FET corresponding to the normally-on type FET 132 shown in FIG. 5 is provided in the driving pulse output circuit 290 for the FET 130 in driving pulse generating circuit 270.

In the following, the structure of FET in driving pulse generating circuit 270 in accordance with the present embodiment will be described with reference to FIGS. 2 and 5.

The drain electrode of normally-on type FET 132 shown in FIG. 5 is connected to the gate electrode of FET 130 and to the pulse driving terminal 112 of driving pulse generating circuit 118. Further, its source electrode is connected to source electrode 144 of FET 130 and to the source terminal 116 of driving pulse generating circuit t118.

Figure 2:
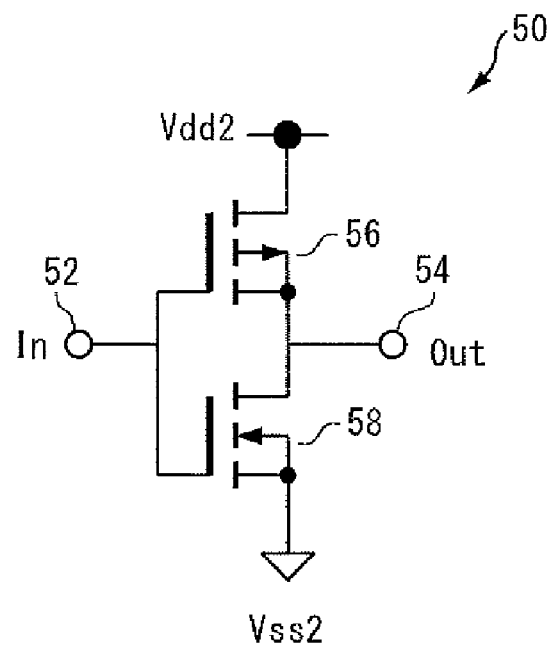
FIG. 2 is a circuit diagram of an output circuit 50 included in a conventional driving pulse generating circuit 22.
Figure 3:
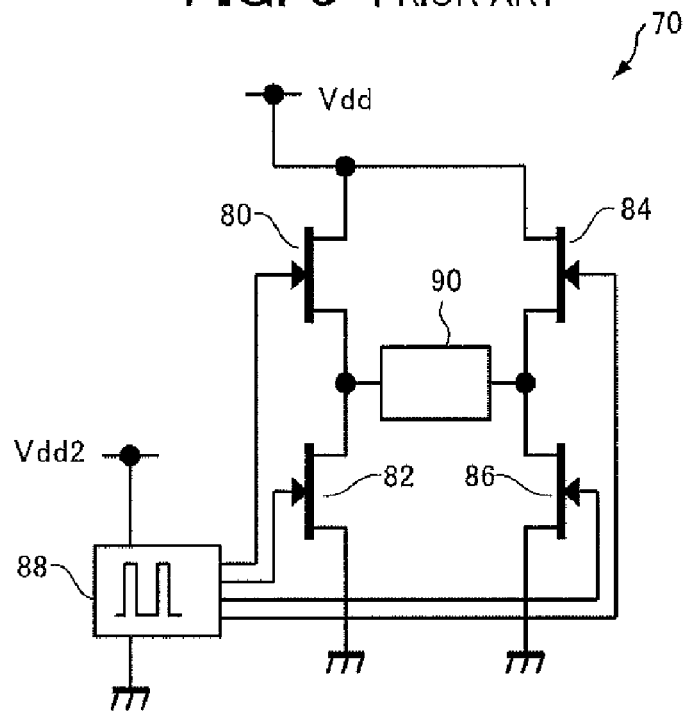
FIG. 3 is a circuit diagram showing a conventional full bridge inverter circuit 70.

Referring to FIG. 2, normally-off type, N-type MOSFET 58 included in output circuit 50 of driving pulse generating circuit 118 has its drain electrode connected to terminal 54 and its source electrode connected to source potential Vss2. Terminal 54 is connected to pulse driving terminal 112 shown in FIG. 5. Source potential Vss2 is common with the source electrode 144 of FET 130. Therefore, from the circuit structure, when normally-off type, N-type MOSFET 58 is replaced by a normally-on type FET, the same function as attained by the normally-on type FET 132 shown in FIG. 5 is realized.

Figure 9:
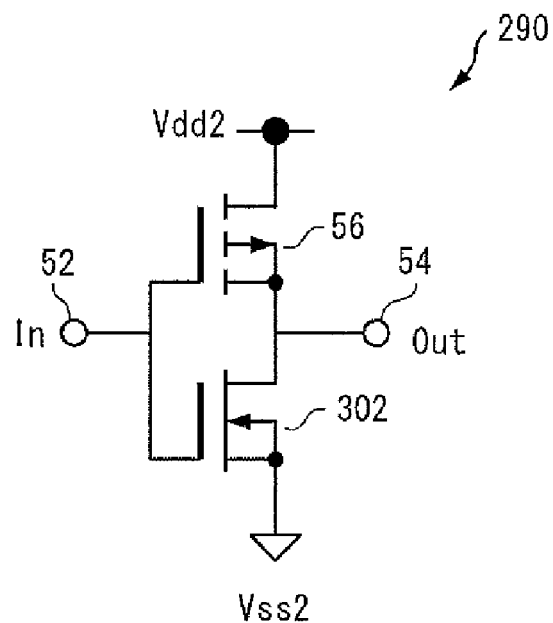
FIG. 9 is a circuit diagram of an output circuit 290 included in driving pulse generating circuit 270 shown in FIG. 8.

Therefore, in the present embodiment, output circuit 290 of driving pulse generating circuit 270 has the following structure. FIG. 9 is a circuit diagram of output circuit 290

Referring to FIG. 9, output circuit 290 corresponds to output circuit 50 shown in FIG. 2, with normally-off type, N-type MOSFET 58 replaced by a normally-on type, N-type MOSFET 302. P-type MOSFET 56 has its source electrode connected to power supply potential Vdd2. Normally-on type, N-type MOSFET 302 has its source electrode connected to source potential Vss2. Drain electrodes of these are commonly connected to output terminal 54. These gate electrodes are commonly connected to input terminal 52.

-Operation-

Switching circuit 260 and driving pulse generating circuit 270 in accordance with the fourth embodiment operate in the following manner.

When driving pulse generating circuit 270 is in operation, normally-on type, N-type MOSFET 302 operates as a common output circuit.

Assume that power supply to driving pulse generating circuit 270 is off. Similar to normally-on type FET 132 of the first embodiment, the potentials of source electrode, drain electrode and gate electrode of normally-on type, N-type MOSFET 302 all come to have the same potential.

Normally-on type, N-type MOSFET 302 turns on. As the normally-on type, N-type MOSFET 302 turns on, the source and gate of FET 130 come to be short-circuited with relatively low impedance. As a result, the voltage between the gate and source of normally-off type FET 130 attains to 0V, and even when a noise signal is applied from the drain of FET 130, FET 130 does not turn on.

Fifth Embodiment

-Structure-

Figure 10:
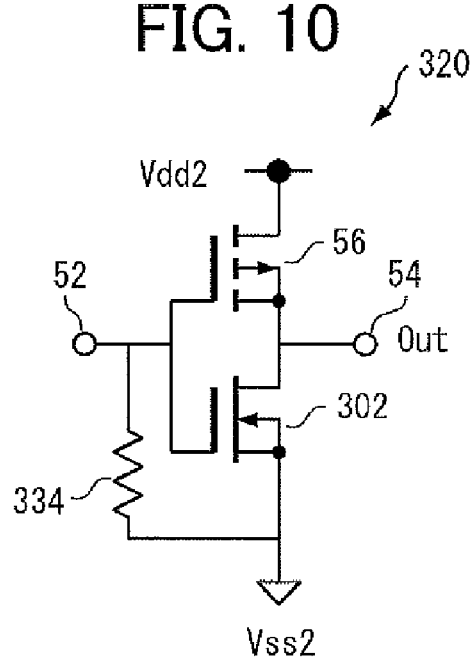
FIG. 10 is a circuit diagram of an output circuit 320 in accordance with a fifth embodiment of the present invention.

FIG. 10 shows a structure of an output circuit 320 used in the driving pulse generating circuit of a switching circuit in accordance with the fifth embodiment of the present invention. Output circuit 320 may be used in place of output circuit 290 of driving pulse generating circuit 270 in accordance with the fourth embodiment.

Output circuit 320 includes, in addition to the structure of output circuit 290 in accordance with the fourth embodiment shown in FIG. 9, a resistor 334 provided between the gate electrode and the source electrode of normally-on type, N-type MOSFET 302. The relation between normally-on type, N-type MOSFET 302 and resistor 334 is the same as the relation between normally-on type FET 132 and resistor 120 of switching circuit 100 (see FIG. 5) in accordance with the first embodiment.

-Operation-

The operation of output circuit 320 shown in FIG. 10 is similar to that of output circuit 290 shown in FIG. 9. It is noted, however, that when the power supply from Vdd2 is off, the on state of normally-on type, N-type MOSFET 302 is attained with higher reliability by resistor 334. The function of resistor 334 at this time is the same as that of resistor 120 in the first embodiment.

Resistor 334 connects the source and gate electrodes of normally-on type, N-type MOSFET 302. Therefore, when the voltage is not applied from power supply voltage Vdd2, the voltage between the source and gate of normally-on type, N-type MOSFET 302 attains to 0V. Normally-on type, N-type MOSFET 302 turns on, whereby the voltage between the gate and source of FET 130 is brought to 0V. Even when a noise signal is applied from drain electrode 142 to FET 130 and further to the gate of FET 130 because of capacitive coupling between the gate/drain, FET 130 never turns on. As a result, malfunction of FET 130 can be prevented.

[Modification]

In the embodiment described above, the source electrode of FET 130 is grounded. The source potential, however, is not limited to the ground, provided that switching by FET 130 is possible.

In the second embodiment, in place of normally-on type FET 200, a normally-off type FET may be used. When we represent the threshold voltage of the normally-off type FET as Vth4 and source/drain voltage as VGS4, in the modification, the devices are adjusted to satisfy the relations of |Vth4|<|Vth2| and |VGS4|<|Vth2|.

The switching circuit operates in the following manner. When the circuit is driven, normally-on type FET 132 is off as described above, and the normally-off type FET is on. When the power supply is cut off, the voltage between source connection terminal 116/gate potential stabilizing control terminal 114 is held as in the third embodiment and, therefore, the normally-off type FET is kept on. Different from the third embodiment, however, normally-on type FET 132 and the normally-off type FET have the same source/gate voltage. Because of the relation |VGS4|<|Vth2|, the voltage between the source/gate of normally-on type FET 132 assumes a value smaller than Vth2, and hence, normally-on type FET 132 turns on. Thus, the same effect as in the first embodiment can be attained.

In the third embodiment, in place of normally-off type FET 240, a normally-on type FET may be used. The switching circuit operates in the following manner. The control voltage is applied to normally-on type FET 132 through gate potential stabilizing control terminal 114 and to the normally-on type FET through source connection terminal 116. In the present embodiment, the control voltage is adjusted such that the normally-on type FET 132 turns off and the normally-on type FET turns on. When the power supply is stopped, as in the second embodiment, the normally-on type FET is on, and it short-circuits the source and gate of normally-on type FET 132. Thus, the same effect as in the first embodiment can be attained.

Applications of switching circuits 100, 190 and 230 in accordance with the first, second and third embodiments and output circuits 290 and 320 in accordance with the fourth and fifth embodiments are not limited to the circuits 100 and 260 shown in FIGS. 5 and 8. For example, the application may include a boosting type chopper circuit commonly used for power factor correction (PFC).

[First Application]

-Structure-

Figure 11:
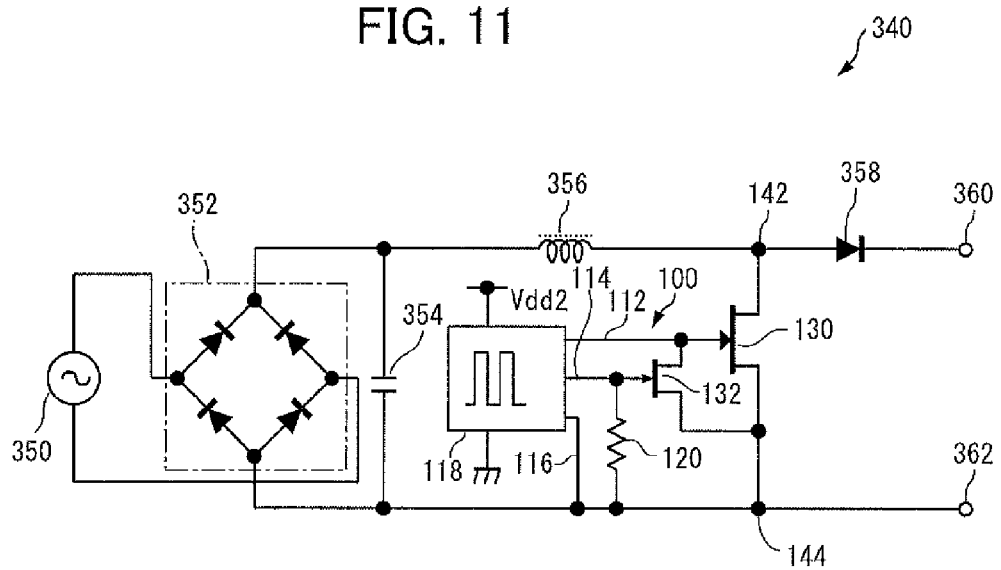
FIG. 11 is a circuit diagram of a chopper circuit 340 in accordance with a first application of the present invention.

FIG. 11 shows a circuit structure of a boosting type chopper circuit 340 commonly used for power factor correction (PFC), including the switching circuit 100 in accordance with the first embodiment of the present invention.

Referring to FIG. 11, chopper circuit 340 includes: a diode bridge 352 connected to a power supply 350 of AC 100V, for rectifying an AC current from power supply 350; a pair of output terminals 360 and 362; a choke coil (inductor) 356 and a rectifying diode 358 connected in series between output terminal 360 and one output terminal of diode bridge 352; and a relatively small capacitor 354 of about a few μF connected between two output terminals of diode bridge 352. Rectifying diode 358 has an anode connected to choke coil 356 and a cathode connected to output terminal 360. Rectifying diode 358 performs high-speed on/off repetition as will be described later and, therefore, it has significant reverse direction recovery loss. For this reason, a Schottky diode or a fast-recovery diode is used as rectifying diode 358. By capacitor 354, the impedance of power supply at the switching frequency is lowered. As the switching frequency, about 60 kHz is selected.

Chopper circuit 340 further includes switching circuit 100 connected between the anode of rectifying diode 358 and output terminal 362, and driving pulse generating circuit 118 connected between the switching circuit 100 and the source electrode 144 of FET 130, for generating driving pulses for switching circuit 100 and applying the same to switching circuit 100.

As described with reference to FIG. 5 above, switching circuit 100 includes FET 130, normally-on type FET 132 and resistor 120. Normally-off type FET 130 has its source electrode connected through output terminal 362 to the ground, its gate electrode connected through pulse driving terminal 112 to driving pulse generating circuit 118, and its drain electrode connected to the anode of rectifying diode 358. Normally-on type FET 132 has its gate electrode connected to gate potential stabilizing control terminal 114 of driving pulse generating circuit 118, its source electrode connected to the source electrode 144 of FET 130, and its drain electrode connected to the gate electrode of FET 130, respectively. Resistor 120 is connected between the gate electrode of normally-on type FET 132 and output terminal 362 (that is, the ground). The source connection terminal 116 of driving pulse generating circuit 118 is connected to output terminal 362.

-Operation-

Referring to FIG. 10, in the normal operation, a negative voltage sufficient to turn on the normally-on type FET 132 is applied to the gate electrode of normally-on type FET 132 from driving pulse generating circuit 118. Therefore, normally-on type FET 132 is off. In this state, a driving voltage is applied to the gate of normally-off type FET 130, and switching operation of the electric power from power supply 350 by normally-off type FET 130 is performed. At this time, the voltage input from power supply 350 has been boosted to a higher voltage.

Generally, power supply potential Vdd2 for driving the driving pulse generating circuit 118 turns on earlier than power supply 350 and, therefore, power supply 350 is always turned on with the switching operation being done.

It is possible, however, that the driving voltage is not at all applied to the gate electrodes of normally-off type FET 130 and normally-on type FET 132, because of failure of power supply, for example, to driving pulse generating circuit 118. Assume that the main power supply 350 is turned on in this state. In the circuitry, the gate and source of normally-on type FET 132 is connected by resistor 120. Therefore, the gate electrode potential and the source electrode potential of normally-on type FET 132 are set to the same value, and the voltage between the gate and source of normally-on type FET 132 attains to 0V. Normally-on type FET 132 turns on, and the source and drain of normally-on type FET 132 is short-circuited with low impedance. Namely, the gate and source of normally-off type FET 130 are set to 0V with low impedance. The voltage between the gate and source of normally-off type FET 130 attains to 0V, and hence, it turns off. In this state, even when a noise signal is input from the outside by inductive coupling or capacitive coupling, the normally-off type FET 130 can be kept off.

It is noted that the threshold voltage of normally-off type FET 130 is about 0.3V and relatively low. Therefore, little leakage current may possibly flow when the voltage between the gate and source is 0V. The current value, however, is very small, and it does not affect chopper circuit 340 and power supply 350.

[Second Application]
-Structure-

Figure 12:
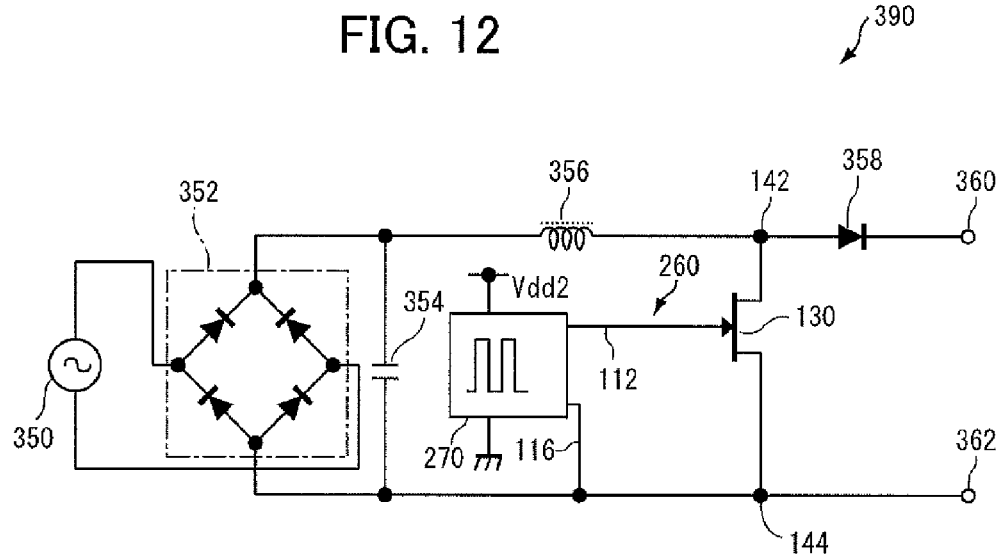
FIG. 12 is a circuit diagram of a chopper circuit 390 in accordance with a second application of the present invention.

FIG. 12 shows a circuit structure of a chopper circuit 390 as a second application of the present invention. Referring to FIG. 12, chopper circuit 390 has a structure similar to that of chopper circuit 340 shown in FIG. 11. However, it is different from chopper circuit 340 shown in FIG. 11 in that it includes a switching circuit 260 and driving pulse generating circuit 270 shown in FIG. 8, in place of switching circuit 100 and driving pulse generating circuit 118 shown in FIG. 11. Driving pulse generating circuit 270 includes output circuit 290 shown in FIG. 9.

-Operation-

The operation and effect of output circuit 290 and chopper circuit 390 in accordance with the second application are the same as the operation and effect of the fourth embodiment and the first application.

[Possible Modifications]

In the embodiments described above, normally-off type FET 130 and normally-on type FET 132 may be fabricated as separate devices, or may be fabricated as one device on the same one substrate.

As discussed in Kawasaki, the threshold voltage of AlGaN/GaN HEMT forming the normally-off type FET 130 may be freely controlled by adjusting the etching time during the process. Specifically, in the AlGaN/GaN IHEMT, by changing the etching time, transistors having different threshold voltages can be formed on one substrate. For a switching device, it is necessary to make on-resistance small, in order to decrease loss. Therefore, normally-off type FET 130 requires a relatively large device size. A device in the order of 1A must have the total gate width of about a few mm.

On the contrary, normally-on type FET 132 may have a relatively small device size of about 100 μm. Device of this size can sufficiently suppress noise voltage generated by inductive or capacitive coupling.

From the foregoing, it can be seen that even when normally-off type FET 130 and normally-on type FET 132 are fabricated on the same substrate, the device size does not much increase.

In the second or third embodiment, normally-off type FET 130, normally-on type FET 132, and normally-on type FET 200 or normally-off type Feet 240 may be formed on one same substrate.

By fabricating these devices on one substrate, the switching circuit can be reduced in size.

Further, by forming these devices on one substrate, the distance between the drain terminal of normally-on type FET 132 and the gate terminal of normally-off type FET 130 can be made very short as compared with the switching circuit formed by fabricating each of these devices on different substrate, and hence, resistance to noise can further be improved.

In the fourth and fifth embodiments, normally-off type, P-type MOSFET 56 and normally-on type, N-type MOSFET 302 shown in FIGS. 9 and 10 may be fabricated utilizing the process for fabricating a common C-MOS circuit. In this case, it is possible to fabricate normally-on type, N-type MOSFET 302 by doping the channel portion with N-type dopant.

In the fifth embodiment, the input impedance to the gate electrode of the FET fabricated by the CMOS process is very high. Therefore, as a resistor 334 to be connected to normally-on type, N-type MOSFET 302, one having high resistance can be used.

As described above, by the present invention, switching less prone to malfunction is realized, by using a normally-off type switching device formed of a wide band-gap semiconductor having the threshold voltage of 2V or lower. As a result, the present invention realizes reduction of on-resistance, higher speed of operation, lower power consumption and smaller size of a switching circuit for a high-power main power supply.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

What is claimed is:

1. A switching circuit, comprising:
    a normally-off type first active device of a wide band-gap semiconductor having a first threshold voltage of two volts or less and first and second electrodes and a first control electrode;
    a driving pulse generating circuit that supplies pulses to the first control electrode; and
    a normally-on type second active device having third and fourth electrodes connected to said first control electrode and said first electrode of said first active device, respectively, and a second control electrode connected to receive a first control voltage from a circuit associated with the driving pulse generating circuit while the driving pulse generating circuit supplies said pulses, the first control voltage being of a magnitude to turn off the normally-on type second active device to prevent it from conducting, wherein
    when the driving pulse generating circuit does not supply said pulses, the second control electrode receives a second control voltage from the circuit associated with the driving pulse generating circuit that is of a magnitude to cause the normally-on type second active device to turn on and maintain the first active device of normally-off type stably off even in the presence of noise voltages at the first or second electrodes.

2. The switching circuit according to claim 1, wherein said first active device includes a normally-off type first field effect transistor having said first and second electrodes and said first control electrode.

3. The switching circuit according to claim 2, wherein said second active device includes a normally-on type second field effect transistor having said third and fourth electrodes connected to said first control electrode and said first electrode of said first field effect transistor, respectively, and said second control electrode.

4. The switching circuit according to claim 3, further comprising
    a resistor circuit connected between said second control electrode and said fourth electrode of said second field effect transistor.

5. The switching circuit according to claim 4, wherein said resistor circuit includes a resistor device connected between said second control electrode and said fourth electrode of said second field effect transistor.

6. The switching circuit according to claim 5, wherein said resistor circuit includes a third, normally-off type active device having a third control electrode and a fifth electrode commonly connected to the second control electrode of said second active device, and a sixth electrode connected to said fourth electrode of said second active device.

7. The switching circuit according to claim 6, wherein said third active device includes a third, normally-off type field effect transistor having the third control electrode and the fifth electrode commonly connected to the second control electrode of said second active device, and the sixth electrode connected to said second electrode of said second active device.

8. The switching circuit according to claim 1, wherein said second active device includes a normally-on type field effect transistor having said third and fourth electrodes connected to said first control electrode and said first electrode of said first active device, respectively, and the second control electrode.

9. The switching circuit according to claim 8, further comprising
    a resistor circuit connected between said second control electrode and said fourth electrode of said normally-on type field effect transistor.

10. The switching circuit according to claim 9, wherein said resistor circuit includes a resistor device connected between said second control electrode and said fourth electrode of said normally-on type field effect transistor.

11. The switching circuit according to claim 10, wherein said resistor circuit includes a third, normally-off type active device having a third control electrode and a fifth electrode commonly connected to the second control electrode of said normally-on type field effect transistor, and a sixth electrode connected to said fourth electrode of said normally-on type field effect transistor.

12. The switching circuit according to claim 11, wherein said third active device includes a third, normally-off type field effect transistor having the third control electrode and fifth electrode, commonly connected to the second control electrode of said normally-on type field effect transistor, and a sixth electrode connected to said fourth electrode of said normally-on type field effect transistor, and wherein
    said third electrode and said fourth electrode of said second active device are connected to said first electrode and said first control electrode of said first active device, respectively.

13. The switching circuit according to claim 1, further comprising
    a third active device of a conductivity type different from that of said second active device, having a first electrode connected to a power supply potential, a second electrode connected to said first control electrode of said first active device, and a control electrode connected to said second control electrode of said second active device, wherein
    said second active device includes an N-type, normally-on type active device.

14. The switching circuit according to claim 13, wherein said third active device includes a P-type, normally-off type active device.

15. A switching circuit, comprising:
    a normally-off type first active device having first and second electrodes and a control electrode; and
    a normally-on type second active device having first and second electrodes connected to said control electrode and said first electrode of said first active device, respectively, and a control electrode, wherein
    said first active device includes a normally-off type first field effect transistor having said first and second electrodes and said control electrode,
    said second active device includes a normally-on type second field effect transistor having said first and second electrodes connected to said control electrode and said first electrode of said first field effect transistor, respectively, and said control electrode of said second active device,
    a resistor circuit is further connected between said control electrode and said second electrode of said second field effect transistor,
    said resistor circuit includes a resistor device connected between said control electrode and said second electrode of said second field effect transistor, and
    said resistor circuit includes a third, normally-on type active device having a first electrode connected to said control electrode of said second field effect transistor, and a control electrode and a second electrode commonly connected to said second electrode of said second field effect transistor.

16. The switching circuit according to claim 15, wherein said third active device includes a third, normally-on type field effect transistor having the first electrode connected to said control electrode of said second active device, and the control electrode and the second electrode commonly connected to said second electrode of said second active device.

17. A switching circuit, comprising:
a normally-off type first active device having first and second electrodes and a control electrode; and
a normally-on type second active device having first and second electrodes connected to said control electrode and said first electrode of said first active device, respectively, and a control electrode, wherein
said second active device includes a normally-on type second field effect transistor having said first and second electrodes connected to said control electrode and said first electrode of said first active device, respectively, and the control electrode of the second active device,
a resistor circuit is further connected between said control electrode and said second electrode of said second field effect transistor, and
said resistor circuit includes a third, normally-on type active device having a first electrode connected to said control electrode of said normally-on type field effect transistor, and a control electrode and a second electrode connected to said second electrode of said normally-on type field effect transistor.

18. The switching circuit according to claim 17, wherein said third active device includes a third, normally-on type field effect transistor having the first electrode connected to said control electrode of said normally-on type field effect transistor, and the control electrode and the second electrode commonly connected to said second electrode of said normally-on type field effect transistor.

19. A circuit, comprising a switching circuit and a driving pulse generating circuit connected to said switching circuit, generating and applying to said switching circuit pulses for driving said switching circuit, wherein
said switching circuit includes a normally-off type first field effect transistor having a control electrode connected to receive said pulses from said driving pulse generating circuit, and first and second electrodes;
said driving pulse generating circuit includes
a control circuit receiving an input signal and generating and outputting a driving signal for driving said first field effect transistor, and
an output circuit connected to receive said driving signal from said control circuit, for applying said pulses making transitions between prescribed first and second potentials to said control electrode of said first field effect transistor in response to said driving signal; and
said output circuit includes
an input terminal connected to receive an output of said control circuit,
an output terminal connected to said control electrode of said first field effect transistor,
a normally-off type, P-type second field effect transistor having a control electrode connected to said input terminal, a first electrode connected to a power supply potential, and a second electrode connected to said output terminal, and
a normally-on type, N-type third field effect transistor having a control electrode connected to said input terminal, a first electrode connected to said first electrode of said first field effect transistor, and a second electrode connected to said output terminal.

* * * * *